(12) United States Patent
Rappaport et al.

(10) Patent No.: US 6,538,484 B1
(45) Date of Patent: Mar. 25, 2003

(54) HIGH-FREQUENCY PWM VOLTAGE CONTROL

(75) Inventors: Elchanan Rappaport, Dolev DN Modi'in (IL); Bernard Harris, Tel Aviv (IL)

(73) Assignee: Lynx-Photonic Networks Ltd., Rosh Ha'Ayin (IL)

( * ) Notice: Subject to any disclaimer, the term of this patent is extended or adjusted under 35 U.S.C. 154(b) by 0 days.

(21) Appl. No.: 10/100,273

(22) Filed: Mar. 18, 2002

(51) Int. Cl.[7] .............................................. H03K 3/017
(52) U.S. Cl. ....................................... 327/172; 327/164
(58) Field of Search ................................ 327/172, 164, 327/165, 170, 173, 174; 330/10, 207 A; 361/186; 363/21.1, 21.11, 21.18, 26, 41

(56) References Cited

U.S. PATENT DOCUMENTS

| | | | |
|---|---|---|---|
| 5,307,407 A | * 4/1994 | Wendt et al. | 379/418 |
| 5,537,305 A | 7/1996 | Colotti | 363/39 |
| 5,757,605 A | * 5/1998 | Furukawa | 361/154 |
| 5,889,424 A | * 3/1999 | Iwata et al. | 327/355 |
| 6,204,649 B1 | 3/2001 | Roman | 323/282 |

* cited by examiner

Primary Examiner—Timothy P. Callahan
Assistant Examiner—Linh Nguyen
(74) Attorney, Agent, or Firm—Ladas & Parry

(57) ABSTRACT

In a control system, with a defined clock rate C—a method and apparatus for generating a train of pulses whose mean level is proportional to a given number V, having N equis-paced possible values, the pulses to be applied to a given low-pass process, the method comprising generating a train of constant-amplitude pulses at a rate that is considerably greater than C/N, when the width of each pulse is an integer multiple of a clock period, 1/C, and the widths of all pulses are not necessarily equal.

29 Claims, 6 Drawing Sheets

HIGH-FREQUENCY PWM VOLTAGE CONTROL

FIELD OF THE INVENTION

This invention relates to generating digitally controlled voltage levels and, in particular, to generating width-modulated pulses for obtaining finely controlled voltage levels after low-pass filtering

BACKGROUND OF THE INVENTION

Dynamically-controlled-level direct voltage, or direct current (DC), is required in a wide range of apparatus types, for a great variety of applications and using various technologies. These include, notably, speed control of DC motors, and analog control of the radiation levels of various devices. A common method for generating a direct voltage with dynamically controlled level, using digital circuitry, is Pulse Width Modulation (PWM). This method is considerably less expensive and more power efficient than utilizing analog circuitry, such as digital-to analog converters, especially when high-resolution control is desired. A typical PWM implementation, providing control by a number, n bits long and thus providing voltage level resolution of $N=2^n$ (2 to the power of n) steps, comprises an n-bit counter, an n-bit comparator, and a flip-flop, as shown in FIG. 1. The counter is fed by a train of clock pulses and whenever it wraps to 0 (i.e. resets itself after reaching maximum count), the flip-flop is set to 1, and when the counter matches the value V of the control number, corresponding to the desired voltage level, the flip-flop is reset to 0. The resulting output waveform is a train of rectangular pulses, whose rate (or frequency), R, is equal to the clock frequency, C, divided by N and whose controllable pulse width is V clock periods, the average voltage thus equaling the desired output level. FIG. 5A shows an example of a waveform for V=17, output from such a prior-art system with n=6 (N=64). The horizontal axis represents time; the units are pulse periods, each being in this case $2^6=64$ clock periods long. It is noted that the value of 6 for n in this and subsequent examples has been chosen for clarity of illustration and that in practice the value of n is much higher, typically around 14.

If a smooth analog output is desired, the output signal is passed through a low-pass filter, which removes the high frequency spectral components, and outputs the desired direct-voltage (or DC) level, plus some ripple at the pulse frequency. In many applications, such as when the voltage produces thermal effects, there is no need for a low-pass filter, since the process, or physical effect, itself has an inherent long time constant, thus behaving like a low-pass filter. In the sequel, any such effect will be understood to come under both the general terms "low-pass filter" and "low-pass process". It will also be understood that any low-pass process has a generally decreasing spectral characteristic, that is—its attenuation is generally increasing with frequency. It is noted that the resolution with which the level is controlled is akin to the resolution (or quantum size) with which the pulse width is determined. The latter is clearly equal to the ratio of a is period of the width-modulated pulses to a clock period, which is 1/N=1/2 ñ.

A typical distribution of amplitude vs. frequency for a typical PWM pulse train of prior art, before and after a low-pass filter, is presented, respectively, in the logarithmically-scaled spectral graphs of FIGS. 2A and 2B. FIG. 2B also shows a typical attenuation graph of the filter. The relevant parameters in this example are: Clock-frequency (C)=50 MHz, n=14 and V=1639, whereby the pulse rate is C/N=3 KHz. It is readily seen that the first few harmonics, which are the primary contributors to the ripple, are attenuated by only a little. For a given low-pass filter, the ripple can be reduced by increasing the pulse rate. The latter can, in turn, be achieved either by decreasing the number of control bits, n, or by increasing the clock frequency. Clearly, decreasing n reduces the resolution of level control, whereas increasing the clock frequency requires more complex or expensive circuitry, or may not even be feasible in a given system or under certain circumstances.

There is therefore a clear need for, and it would be advantageous to have, a method for digitally generating pulses that, when applied to a given low-pass filter, result in direct voltage with reduced ripple power, yet whose level is controllable at high resolution.

It is noted that in some current applications the frequency of the pulses is sometimes varied for reasons other than that discussed above. A notable reason is the desire to avoid radio-frequency interference (RFI) from. the circuits. In U.S. Pat. No. 6,204,649 to Roman, for example, there is disclosed a PWM controller which incorporates a varying frequency oscillator, causing the frequency of a switching regulator to vary, thus spreading out the EMI noise generated by it. Also in U.S. Pat. No. 5,537,305 to Colotti there is disclosed a switching power supply, whose switching frequency is varied so as to avoid interference. In all such and other cases, however, the frequency is typically shifted by a relatively small amount, which would be insignificant for ripple reduction; moreover, even when there is a considerable frequency shift, there is no attempt to retain the resolution of the level control.

Dynamic control of the voltage level means that the control number itself varies with time, requiring also the controlled direct voltage level to vary accordingly. As long as this variation is substantially slower than the pulse rate and is well within the pass band of the low-pass filter, the method discussed above is valid, whereby any average of the pulse train is computed over a period equal to a sufficient number of pulse periods, yet short enough for any variation of the control value to be insignificant.

In many cases, the application calls for a plurality of voltage levels to be independently controlled. In prior art systems, this is achieved by simple repetition of the relevant circuits, which may prove to be unduly expensive.

SUMMARY OF THE INVENTION

It is the object of the present invention to provide a method for reducing ripple in a digitally controlled direct voltage level output by a given low-pass filter operating on a train of width-modulated pulses, without reducing resolution, and without requiring a higher clock frequency.

The basic principle underlying the method of the invention is to generate the pulses at a rate R that is much higher than that proscribed by the clock frequency and the length, n, of the control number (as explained above). The rate R is chosen to be equal to, or higher than, the lowest frequency for which the filter's attenuation, is greater than a desired value. The width of the pulses is modulated so that, on the average, it is exactly proportional to the control number, while the width of individual pulses varies cyclically. Preferably the pulse widths are selected from two values—wide and narrow, differing by one clock period, wide pulses being preferably interleaved with narrow pulses. The ratio of wider pulses to the total number of pulses in a cycle is proportional, to the difference between the exact desired level and the level that would be attained if all the pulses were narrow.

Specifically, according to one configuration of the invention, the pulse rate R is chosen to be some integral multiple, G, of the prior-art pulse rate C/N; that is R=G*C/N. The given control value, V, is divided by G, resulting in an integral dividend P and a remainder S. A train of pulses is first generated at rate R, the width of the pulses being exactly proportional to P. These pulses are then modified as follows: The train is logically grouped into successive cycles of G consecutive pulses each. Within each cycle, a certain quantity of pulses is selected, in proportion to the value S and each selected pulse is widened by one clock period. Preferably the selected pulses are distributed evenly over the group so as to minimize low frequency components. Clearly, the average level of the resulting pulses, averaged over a cycle, will be proportional to G*P+S, which is equal to V.

Since the control value, V is usually given as an n-bits binary number, the pulse rate multiplier, G, is preferably chosen to be equal to 2^s, s being an integer. The division of V by G then amounts to evaluating the s low-order bits of V as representing S and the p=n−s high-order bits of V—as representing P.

It is noted that a group of G pulses occupies a period of N(=2^n) clock periods, which is also the pulse period in a conventional PWM system. The important difference is that, while in the conventional system this period is occupied by a single pulse and thus determines the main frequency component of the pulse train, a cycle of the pulse train produced according to the invented method consists of a large number, G, of pulses and thus, in general—has spectral components of much higher frequencies. Thus, for a given clock frequency, C, and a given resolution, N, of the level control number, the basic pulse rate is increased from C/N, in the conventional method, to G*C/N, thus becoming much more attenuated by any given low-pass filter. There are some remanent frequency components at the original, low pulse rate and its harmonics (due to the necessarily imperfect distribution of wide and narrow pulses), but their amplitude is relatively very low.

An extreme choice of parameters is p=0 and s=n; thus G=N. In this case, all narrow pulses have zero width and the width of a wide pulse is one clock period. The number of non-zero pulses in a cycle will then be proportional to the value of the control number and the basic pulse rate may reach half of C. Clearly, in this case the pulse train will have strong spectral components at very high frequencies, which will therefore be maximally attenuated.

Apparatus embodying the method of the invention is also disclosed. In a preferred embodiment it consists of a width-modulating pulse generator, producing a train of pulses whose width is proportional to P, and a pulse width modifier, which increases the width of S pulses within each cycle by one clock period.

More specifically, the invention, applicable to a control system, is of a method for generating a train of pulses whose mean level is proportional to a given number V, having N equispaced possible values, the pulses to be applied to a given low-pass process, there being defined for the system a clock rate C, the method comprising:
   (a) determining a frequency F, above which the relative attenuation of the low-pass process is greater than, a given value,
   (b) generating a train of constant-amplitude pulses at a rate R equal to or greater than F, the width of each pulse being an integer multiple of a clock period, 1/C, and the widths of all pulses being not necessarily equal, and
   (c) logically dividing the train of pulses into successive cycles;

wherein the average width of pulses over each cycle is proportional to V and wherein R may be greater than C/N.

According to further features of the invented method, the duration of each cycle is that of N clock periods and any pulse has one of two width values, wide and narrow, differing by one clock period, wide and narrow pulses being optimally interleaved, namely as evenly distributed as possible, so that the amplitude of any resulting frequency component below R is minimized.

In a particular configuration the method further comprises:
   (d) dividing V by G=N*R/C, resulting in an integral dividend P and a remainder S;
and the width of each narrow pulse is P clock periods and the number of wide pulses in each cycle is S.

According to further features of this configuration, N=2 exp(n) (2 to the power n), n being an integer, and V is represented by a binary number with n bits; and the dividing in step d includes grouping the binary representation of V into p high-order bits and s low-order bits, where p=log 2(N/G) and s=n−p, the p high-order bits representing a value P and the s low-order bits representing a value S.

According to other features of the invented method, the generating in step b includes:
   (i) generating a train of primary pulses, all of them being either narrow or wide;
   (ii) selecting pulses within each cycle; and
   (iii) changing the width of each of the selected pulses.

According to an alternative configuration of the invented method, the generating in step b includes:
   (iv) generating two synchronous pulse trains, a first train being of narrow pulses, and a second train being of wide pulses;
   (v) selectively switching pulses from the two trains into a common output path so that over each cycle there will be output exactly S wide pulses.

According to another alternative configuration of the invented method, step d is executed once for each possible value of V over one cycle, the resultant patterns of pulses are stored and the generating in step b includes periodically reading out a pattern of pulses corresponding to the given number V.

In another particular configuration, R=C and the width of each pulse is selected from the values zero and one clock period.

According to an alternative aspect of the latter configuration, the method of the invention comprises:
   (a) logically defining successive time cycles, each being N clock periods long, and logically dividing each cycle into N equal time slots;
   (b) For each cycle, assigning to each time slot a value selected from zero and a given pulse amplitude.
wherein the assigning is such that the mean value of all time slots over the respective cycle is proportional to V and that no two adjacent time slots are assigned the pulse amplitude value if V is equal to or less than half its maximum possible value, and no two adjacent time slots are assigned zero value, if V is greater than half its maximum possible value.

According to another aspect of the invention, as applicable to a control system, there is provided a pulse generator for generating a train of control pulses whose mean level is proportional to a given number V, having N equispaced possible values, the pulses to be applied to a given low-pass process, there being provided by the system a train of clock pulses, at a rate C and with a period 1/C, the pulse generator comprising:

a controlled-width pulse generator (CWPG), operative to generate a train of primary pulses at constant amplitude, constant rate R and constant width, the rate being equal to or greater than the frequency at which the relative attenuation of the low-pass process becomes greater than a given value, and the width being an integral multiple of the clock period; and a pulse width modifier, operative to select primary pulses output by the CWPG and to modify the width of the selected pulses by an integral multiple of the clock period, its output being the train of control pulses;

whereby the constant width, the selecting and the modifying are such that the average pulse width over each successive cycle of control pulses is proportional to V and whereby R may be greater than C/N.

According to further features of the invention, the modifier includes:

a secondary pulse generator, operative to generate a secondary pulse for each selected primary pulse, the width of each secondary pulse being essentially equal to the respective modification; and a combiner, operative to combine the secondary pulses with corresponding ones of the selected primary pulses.

According to an alternative configuration of the invention, the pulse generator comprises:

a plurality of controlled-width pulse generators, each operative to generate a train of primary pulses at a common constant amplitude, a common constant rate R, greater than C/N, and constant width, the pulse widths of the several trains being mutually different; and a switch, operative to select for each pulse period one of said generated trains and to feed said selected train to a common output terminal.

According to another alternative configuration of the invention, the pulse generator comprises:

a lookup table, having N entries—one for each possible value of V, there being stored at each entry a pattern of a plurality of pulses, the pattern having a length of N clock pulses, the pulses being of various widths and the mean level of each pattern being proportional to the corresponding value of V; and an addressor, operative, for each successive period of N clock pulses, to address said lookup table according to the given number V and to cause the corresponding stored pattern to be read out therefrom so as to become a train of control pulses.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 3A:
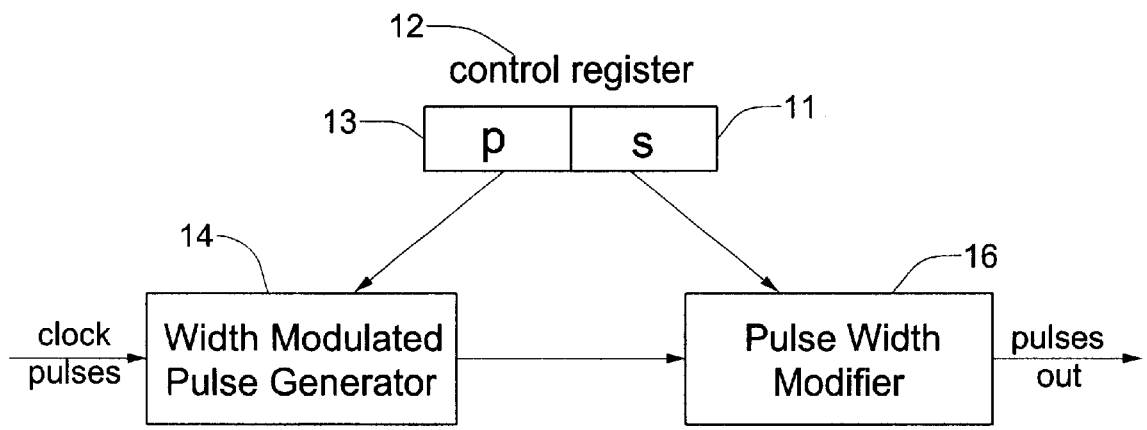
FIG. 3A is a top-level block diagram of a width-modulated pulse generator according to a preferred embodiment of the invention.

FIG. 3A presents a simplified block diagram of exemplary apparatus to embody the invention. There is a shown a register 12 into which is fed the n-bits control number. The register consists of two sections: A first section 13, of length p, holds the high-order bits component of the control number, while a second section 11, of length s, holds the low-order bits component. The high-order bits component from section 13, whose value as a binary number is P, is applied to a width-modulating pulse generator (WMPG) 14, which is also fed a train of clock pulses, of rate (or frequency) c and period 1/c. The pulses output by WMPG 14, to be referred to as primary pulses, are of constant width, proportional to P; more exactly, the width is equal to P/c, i.e. P clock periods. These are fed to a pulse width modifier (PWM) 16, to which also is applied the low-order bits component from register section 11, whose value as a binary number is S. PWM 16 preferably selects, from each cycle of $2^s$ successive pulses, S pulses and widens each of them by one clock period. The resulting train of pulses, having slightly unequal widths, becomes the output of the apparatus and may be applied to a low-pass filter, to obtain direct voltage, or may be used directly in any slow-response process.

Figure 5A:
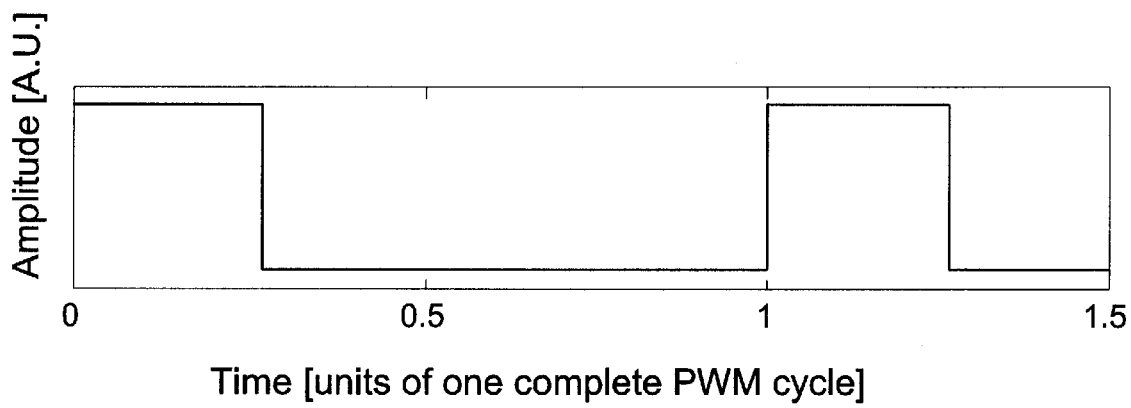
FIGS. 5A–5C show exemplary signals output by two configurations of the pulse generator according to the invention, in comparison with those output by systems of prior art.
Figure 5B:
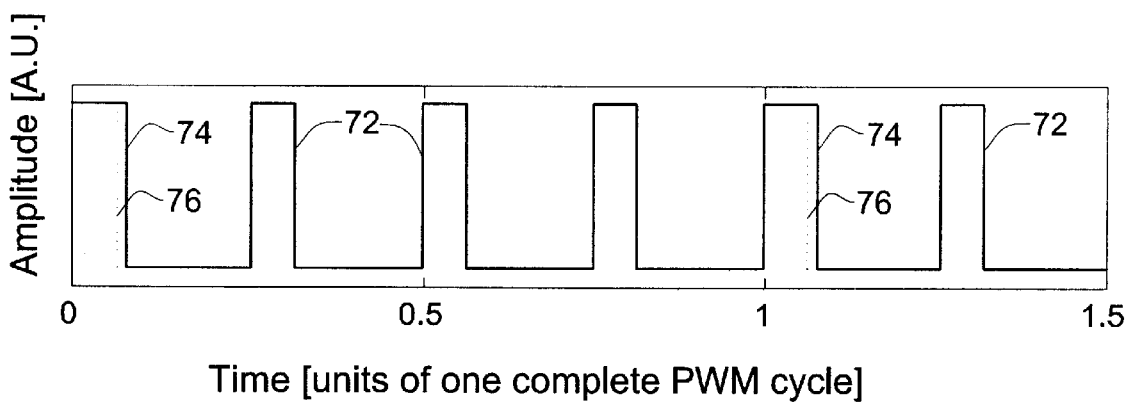

FIG. 5B shows an exemplary pulse train produced by the apparatus of FIG. 3A. In this illustrative example the given parameters are the same as in the example of FIG. 5A, discussed above in the Background section, namely n=6 and V=17. The two drawings have identical time scales (horizontal axis) and are presented in time alignment, for mutual comparison. In the example of FIG. 5B, the two additional parameters, peculiar to the invented method, have the values p=4, s=2. By way of clarification, it may be pointed out that, in terms of these new parameters, the prior-art example of FIG. 5A is equivalent to p=6, s=0. Looking more closely at FIG. 5B, it is noted that the basic pulse rate is here four times that of the pulses in FIG. 5A. More generally, the ratio of basic pulse rate produced by the invented method to that produced by prior art methods is equal to $2^s$. It is further observed that every fourth pulse 74 is wider than the other pulses 72, In each such wider pulse 74, a dotted line 76 marks the width of the narrower pulses; the distance from a dotted line 76 to the trailing edge of the respective pulse 74 is equal to one clock period. The explanation to these observations is that, in general, $V = P*2^s + S$ and in this example, $17 = 4*2^2 + 1$. Thus in the present example, with V=17, the components 13 (p) and 11 (s) in the control register 12 (FIG. 3A) have the values P=4 (out of a maximum of $2^4=16$) and S=1 (out of a maximum of $2^2=4$), respectively and consequently the narrow pulses are 4 (=P) clock periods wide and 1 (=S) pulse in every cycle of 4 (=$2^s$) pulses is wider by one clock period. It is noted that if V were 18, S would be 2 and then every second pulse would be wider; if V were 19, S would be 3 and then every three pulses, out of four, would be wider.

Figure 3B:
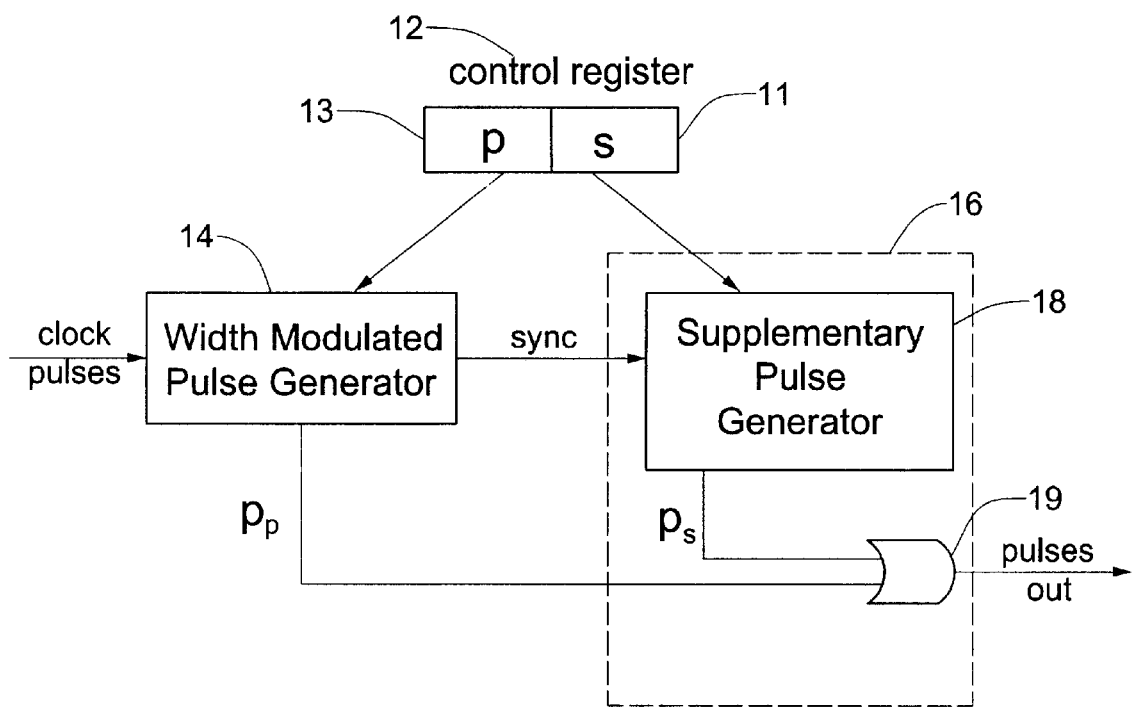
FIG. 3B is a more detailed block diagram of the pulse generator of FIG. 3A.

Pulse width modifier 16 according to the preferred embodiment is shown in some more detail in FIG. 3B. It is seen to consist of a supplementary pulse generator (SPG) 18 and a combiner, or OR-gate, 19. To SPG 18 is applied the low-order bits component, s, from register section 11 as well as a pulse synchronization signal from WMPG 14. SPG 18 is operative to cyclically count the primary pulses generated by WMPG 14 and, for each of S such pulses within a cycle, generate a narrow secondary pulse, whose width is preferably one clock period. The timing of the secondary pulse is such that it occurs just prior to the leading edge, or just after the trailing edge, of the corresponding primary pulse. The primary pulses, $p_P$, from WMPG 14 and any secondary pulses, $p_S$, from, SPG 18 are fed to respective inputs of combiner 19. As a result, the pulses put out by combiner 19 are slightly wider than, or identical with, the corresponding primary pulses, depending on whether a secondary pulse has or has not been generated. In the example illustrated by FIG. 5B, the area between dotted line 76 and trailing edge of wide pulse 74 represents a secondary pulse, $p_S$, timed to just follow the trailing edge of a primary pulse, $p_P$.

Figure 1:
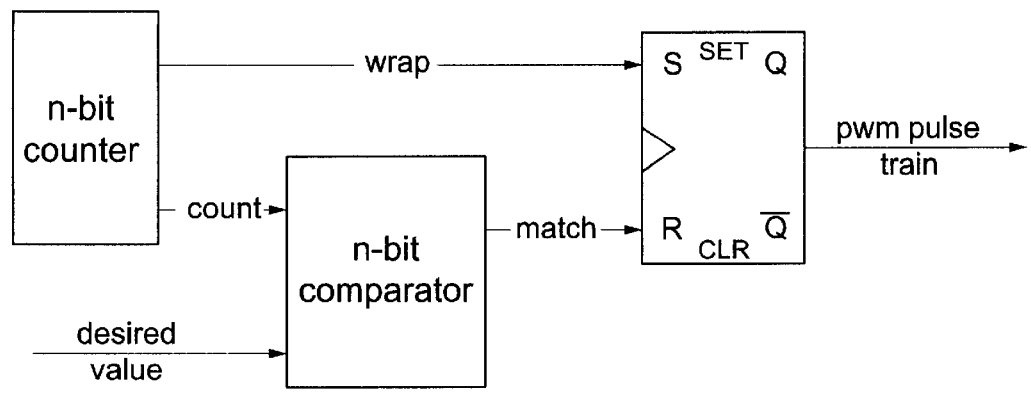
FIG. 1 is a schematic block diagram of a width-modulated pulse generator of prior art.
Figure 2A:
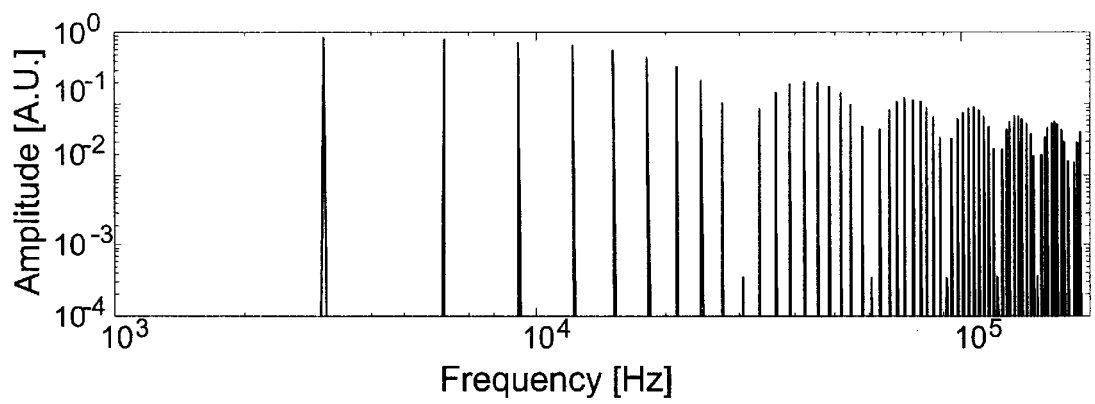
FIGS. 2A and 2B show spectra of a typical output of the pulse generator of FIG. 1 before and after low-pass filtering, respectively.
Figure 2B:
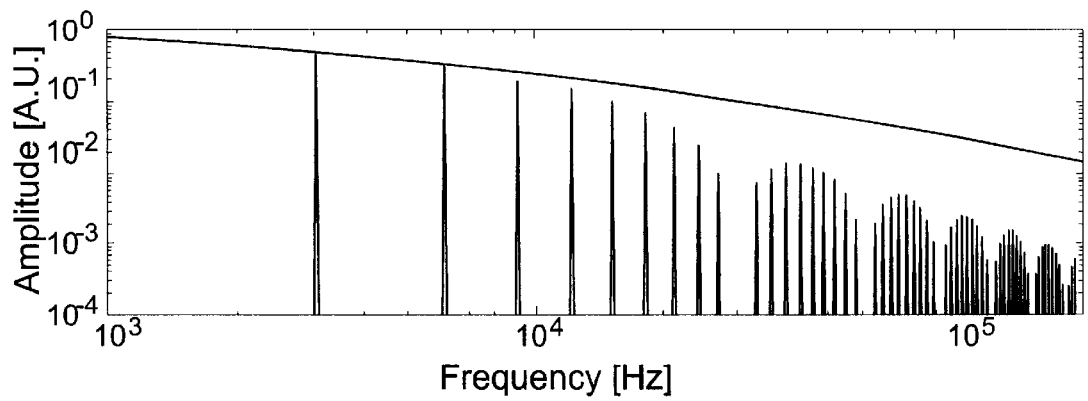
Figure 4A:
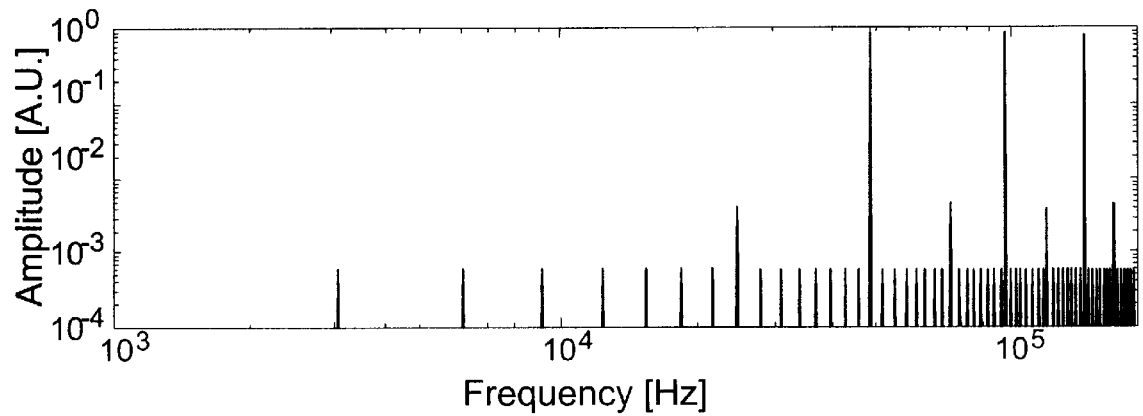
FIGS. 4A and 4B show spectra of a typical output of the pulse generator of the invention.
Figure 4B:
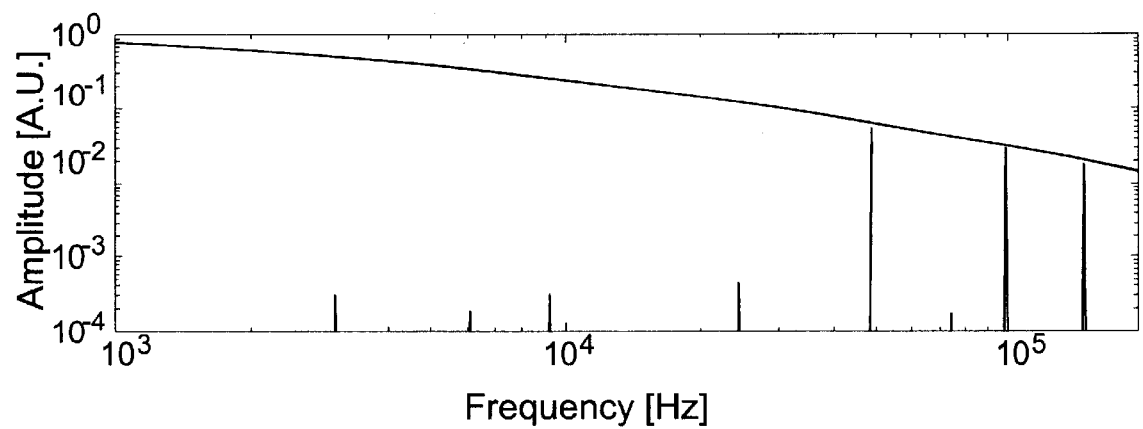

The output pulses are applied to a low-pass filter, if necessary, or directly to the slow process requiring the direct voltage. It is readily seen that for a given clock frequency, f, and a given resolution (i.e. number of bits) of the level control number, V, the basic pulse rate is increased by $2^s$, from $f/(2^n)$ in the conventional method, to $f/(2^p)$, thus becoming much more attenuated by any given low-pass filter. There are some remanent frequency components at the original, low pulse rate and its harmonics, but their amplitude is relatively very low. A typical distribution of amplitude vs. frequency, before and after the filter, is presented, respectively, in the logarithmically-scaled spectral graphs of FIGS. 4A and 4B, which should be compared with the results of prior art, based on identical given parameters n and V and shown in the similar graphs of FIGS. 2A and 2B, respectively. It will be observed that the highest amplitude components are now at much higher frequencies, and consequently are considerably more attenuated by the filter, than in the prior-art case. The selection of particular S pulses to be widened is not critical; it is, however, preferably such that they are as evenly distributed over a cycle, or over successive cycles, as possible, in order to maximally reduce the amplitude of the resulting low-frequency subharmonics. An extreme counter-example would be in a case that $S=2^{(s-1)}$ (requiring about half the pulses to be wide), whereby all wide pulses are during the first half of the cycle; there would then be a substantial output component at the cycle frequency, (which equals the pulse rate obtained by conventional methods for similar resolution and clock rate), though its amplitude would still be significantly lower than with conventional methods. One preferred algorithm for selecting the pulses to be widened within a cycle is the following: The s bits of the secondary (lowest-order) section of the control number are examined. For a 1 in the first (highest-order) bit, all the odd-numbered pulses along a cycle are selected, e.g. No. 1, 3, 5, etc. For a 1 in the second bit, all the odd ones of the remaining (i.e originally even-numbered) pulses are selected, e.g. no. 2, 6, 10, etc. For a 1 in the third bit, the odd ones of the still remaining pulses are selected, and so on. Clearly, other selection schemes are also possible.

Figure 3C:
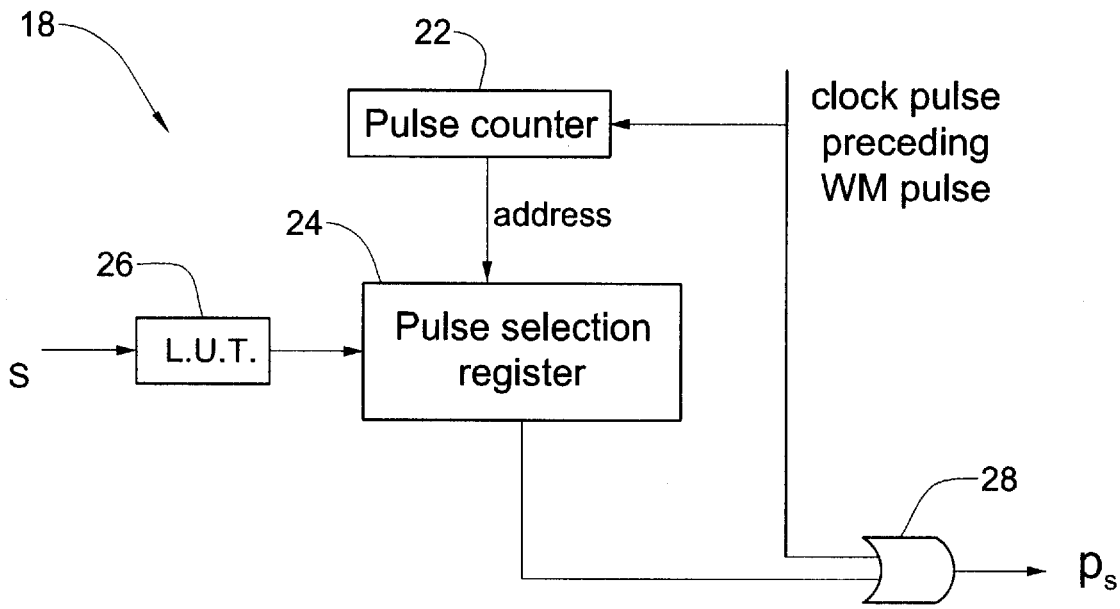
FIG. 3C shows an embodiment of the Supplementary Pulse Generator of FIG. 3B.

An exemplary specific embodiment of the SPG 18 of FIG. 3B is shown in FIG. 3C. It is seen to comprise a pulse-counter 22 that is s bits long, a pulse selection register (PSR) 24, holding $2^s$ bits, a look-up table (IUT) 26 and an "and" gate 28. LUT 26 has stored therein the pulse selections for each value of S (which need be loaded only once, during setup). A current S value is fed from control number section register 11 (FIG. 3A) to LUT 26 and a corresponding pattern of $2^s$ bits is read out from it and loaded into PSR 24. Pulse counter 22 receives a short synchronization pulse at the beginning of each primary WM pulse, generated by PWM pulse generator 14 (FIG. 3A), and increments its count accordingly; the count wraps to 0 after $2^s$ pulses (full cycle). The count from pulse counter 22 is applied as an address to PSR 24 and the corresponding bit stored therein is read out. The read out bit is applied to one input of "and" gate 28, the other input being a pulse whose width is one clock period and occurring just prior to the beginning of the primary PW pulse. The latter is obtained from PWM pulse generator 14 and may optionally also serve as the sync pulse to pulse counter 22. The output of "and" gate 28 is thus supplementary pulses, occurring just prior to the beginning of each primary pulse that corresponds to a "1" in PSR 24 and these are applied as one of the inputs to "or" gate 19 (FIG. 3B).

Figure 3D:
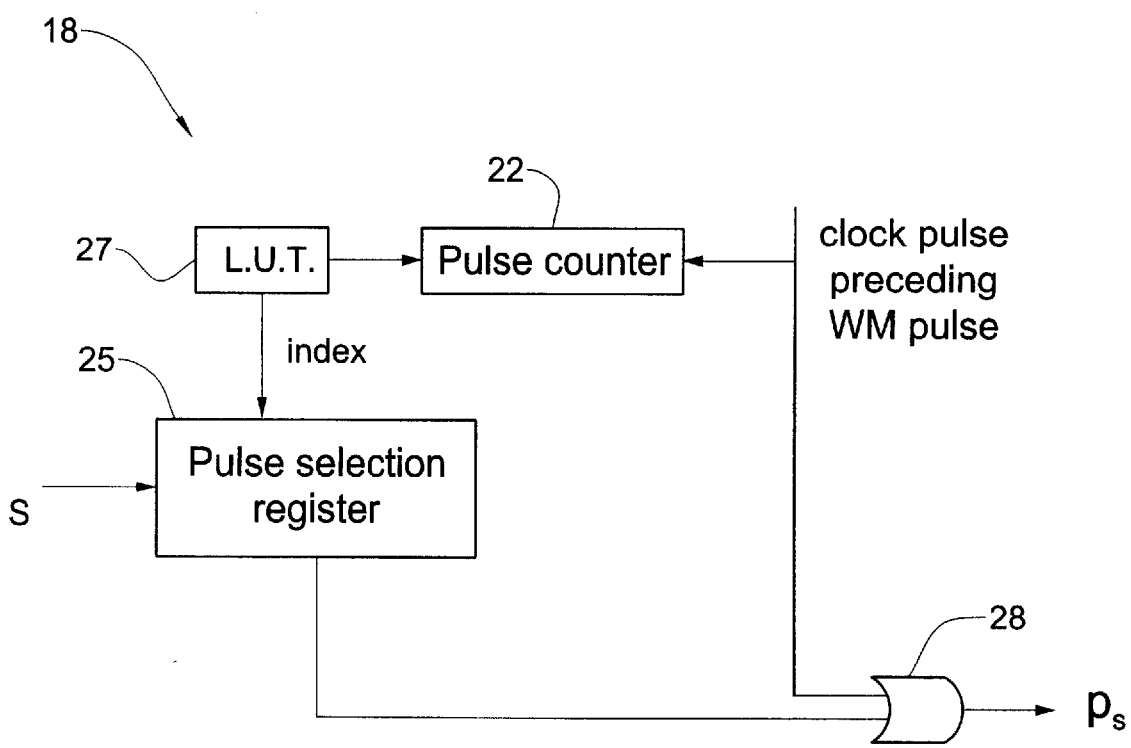
FIG. 3D shows an alternative embodiment of the Supplementary Pulse Generator of FIG. 3B.

An exemplary alternative embodiment of SPG 18, which is designed specifically to realize the secondary pulse selection algorithm described above, is shown in FIG. 3D. It is seen to comprise a pulse-counter 22 that is s bits long (similar to that of the embodiment of FIG. 3C), a look-up table (LUT) 27, a pulse selection register (PSR) 25, holding 1+s bits, and an "and" gate 28. LUT 27 consists of $2^s$ entries, each corresponding to a pulse position within a full cycle. A current S value is fed from control. number section register 11 (FIG. 3A) to PSR 25 and stored in its s least significant bit positions; the most significant bit position preferably holds a zero value at all times. Pulse counter 22 receives a short synchronization pulse at the beginning of each primary WM pulse, generated by PWM pulse generator 14 (FIG. 3A), and increments its count accordingly; the count wraps to 0 after $2^s$ pulses (full cycle). The count from pulse counter 22 is applied as an address to LUT 27 and the corresponding entry is read out and interpreted as an index into a bit position in PSR 25. The number of bits in each entry of LUT 27 is sufficient to specify any of the s+1 bit positions in PSR 25, marking these bit positions, from the least to the most significant, with 0 to s and in line with the selection algorithm disclosed above, the values actually stored in LUT 27 are preferably as follows: All the odd-numbered entries hold the value s−1; all the odd ones of the remaining (i.e. originally even—numbered) entries hold the value s−2; the odd ones of the still remaining entries hold the value s−3, etc.; the last entry holds the value s (which, it is recalled, points to the MSB of PSR 25, which is always zero). During operation, there will be generated a secondary pulse at each pulse position for which there is a 1 stored at the correspondingly indexed bit position of PSR 25. It will be appreciated that, according to this preferred algorithm, there will never be a secondary pulse at the last $(2^s-1)$ position in a cycle and that this may be specified also in other ways than by the 0 stored at the MSB of PSR 25. The embodiment of FIG. 4D has the advantage of relatively small LUT and PSR, making it very economical.

In applications where there is a need for a plurality of voltage levels to be controlled, the circuitry of FIG. 3C can be economically adapted to the purpose, without simply duplicating it in toto, provided that all levels are controlled with the same resolution. For such a multi-channel application, pulse counter 22 can be shared by all channels and the pulse selection register (PSR) 24 is widened to have at each address a bit for each channel. It is noted that LUT 26 may also be shared by all channels, by proper gating arrangements. There is an "and" gate 28 for each channel and the bits output from PSR 24 are directed to corresponding gates 28. Clearly, there is also a PWM pulse generator (WMPG) 14 and control register 12 (FIG. 3A) as well as a combiner 19 (FIG. 3B) for each channel. In cases where the levels in all channels are nearly the same and vary among them only slightly, a single WMPG 14 may serve all. The circuitry of FIG. 3D may be similarly modified. The range of variation among the channels in such cases may be increased by increasing s and reducing p, or alternatively, by allowing secondary pulses to be wider than a single clock period. Other configurations and modifications of the method and of the apparatus disclosed above are possible, all coming within the scope of the invention. For example, the secondary pulses may be subtracted from, rather than added to, the primary pulses, or the secondary pulses may be timed to occur not necessarily near the edge of corresponding primary pulses. Another possibility is to generate two mutually synchronous trains of WM pulses, one of width P and one of width P+1, and to select pulses from the two trains according to the value S, switching the selected pulses into a common output path. Yet another possibility is to compute an optimal pattern of pulses over one cycle for each possible value of V and to store these patterns in a lookup table (LUT); during operation, the given value of V is applied as address to the LUT and the corresponding pattern is read out for each cycle and converted into a continuous pulse train.

While the embodiments have been described above in terms of hardware components, the method is also applicable in terms of suitable programming of one or more, digital processors or of a general-purpose computer.

Figure 5C:
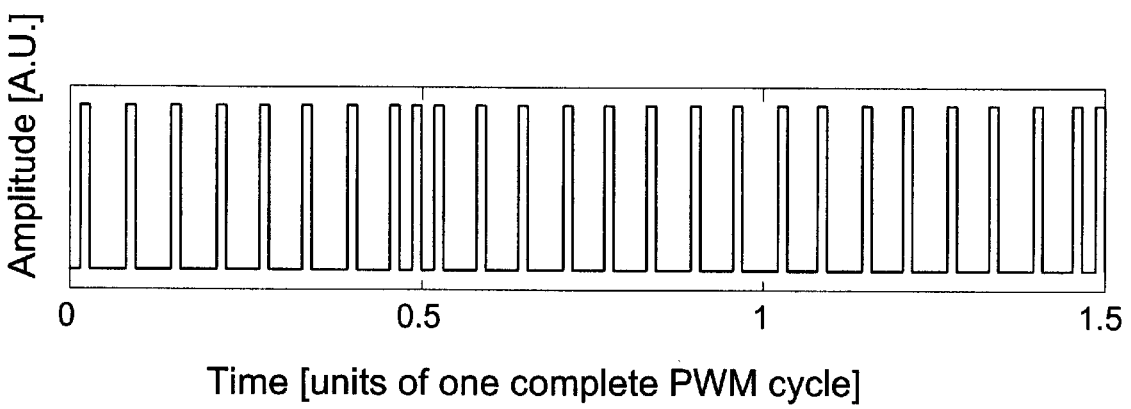

In a particular configuration of the invention, p is chosen to be zero and consequently s=n. In this case the pulse frequency may reach the order of the clock frequency and thus—the high-attenuation range of the filter. The cycle— (i.e. group—), length is still N clock periods (equaling the pulse period in a conventions PWM system). This period may now be occupied by any number of one-clock-period wide pulses; preferably they are evenly distributed, possibly according to an algorithm similar to that used for selecting pulses to be widened (described above), and then their number remains proportional to V up to N/2; for higher values of V the pulses cluster and tire number of one-clock-period wide gaps between them becomes proportional to $V_{max}$-V. FIG. 5C illustrates a typical waveform of this configuration, for the same given parameters used in the examples of the previously discussed configuration, illustrated in FIG. 5B and of a convention system, illustrated in FIG. 5A—presented with a common time scale, so as to be mutually comparable.

Figure 6A:
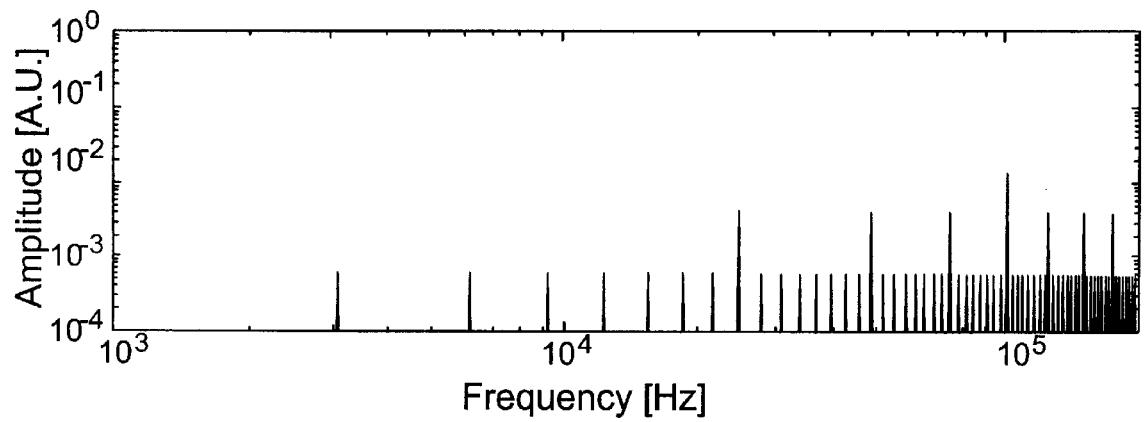
FIGS. 6A and 6B show spectra of a typical output of the configuration of FIG. 5C.
Figure 6B:
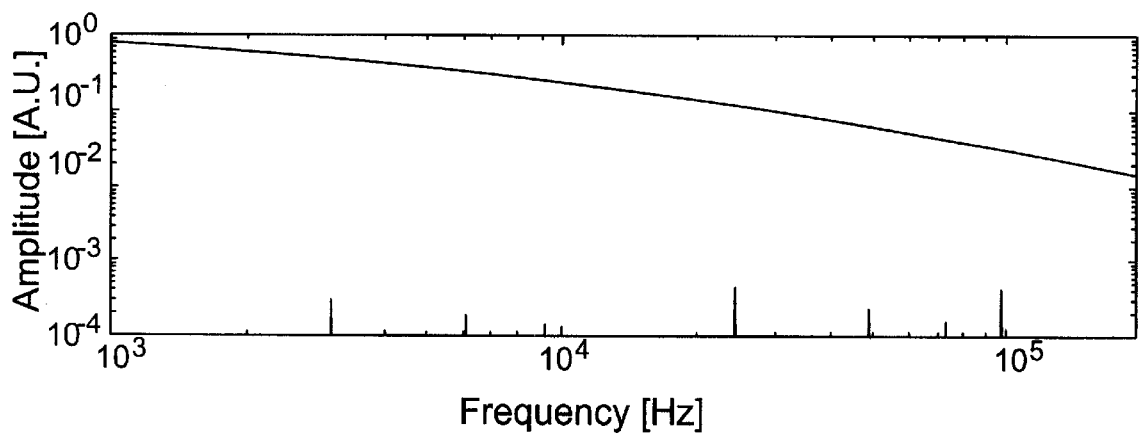

The spectrum of a typical, signal resulting from the latter configuration, before and after filtering, is illustrated in FIGS. 6A and 6B, respectively. These should be compared with the corresponding spectra of FIGS. 4A and 4B (for the general configuration of the invention) and of FIGS. 2A and 2B (for conventional methods)—all for identical given parameters V and n. It is noted that the value of n in the illustrated spectra has been chosen to be relatively low—for clarity (though it is still higher, and thus more realistic, than in the examples of FIGS. 5A–C); actual systems, n may be 14 or more and in this case the differences between the resulting spectra from the various methods and configurations are even more significant.

Apparatus for this latter configuration of the invention may be similar to that depicted in FIGS. 3B and 3C, except that WMPG 14 is now superfluous, the nominal width of $p_p$ being uniformly zero, and thus the output pulses consist merely secondary pulses $p_s$.

What is claimed is:

1. In a control system, a method for generating a train of pulses whose mean level is proportional to a given number V, V having N equispaced possible values wherein N is $\geq 1$, the pulses to be applied to a given low-pass process and there being defined for the system a clock rate C, the method comprising:

(a) determining a frequency F, above which the attenuation of the low-pass process is greater than a given value, (b) generating a train of constant-amplitude pulses at a rate R equal to or greater than F, a width of each of the pulses being an integer multiple of a clock period, 1/C, and the widths of all pulses being not necessarily equal, and (c) logically dividing said train of pulses into successive cycles;

wherein the average width of pulses over each cycle is proportional to V and wherein R is greater than C/N.

2. The method of claim 1, wherein the widths of any two pulses differ by at most one clock period.

3. The method of claim 1, wherein the duration of each cycle is that of N clock periods.

4. The method of claim 3, wherein any pulse has one of two width values, wide and narrow, differing by one clock period.

5. The method of claim 4, wherein wide and narrow pulses are optimally interleaved.

6. The method of claim 5, wherein wide and narrow pulses are interleaved so that the amplitude of any resulting frequency component below R is minimized.

7. The method of claim 5, wherein wide and narrow pulses are interleaved so as to be as evenly distributed as possible.

8. The method of claim 4, further comprising:

(d) dividing V by G=N*R/C, resulting in an integral dividend P and a remainder S;

and wherein the width of each narrow pulse is P clock periods and the number of wide pulses in each cycle is S.

9. The method of claim 8, wherein N=2 exp(n) (2 to the power n), n being an integer, and V is represented by a binary number with n bits;

and wherein said dividing in step (d) includes grouping the binary representation of V into p high-order bits and s low-order bits, where p=log 2(N/G) and s=n–p, the p high-order bits representing a value P and the s low-order bits representing a value S.

10. The method of claim 8, wherein said generating in step b includes:

(i) generating a train of primary pulses, all of them being either narrow or wide;

(ii) selecting pulses within each cycle; and (iii) changing the width of each of said selected pulses.

11. The method of claim 10, wherein in substep (i) all pulses are narrow, in substep (ii) said selecting is selecting S pulses and in substep (iii) said changing includes widening by one clock period.

12. The method of claim 10, wherein in substep (i) all pulses are wide, in substep (ii) said selecting is selecting G–S pulses and in substep (iii) said changing includes narrowing by one clock period.

13. The method of claim 8, wherein said generating in step b includes:

(iv) generating two synchronous pulse trains, a first train being of narrow pulses, and a second train being of wide pulses;

(v) selectively switching pulses from said two trains into a common output path so that over each cycle there will be output exactly S wide pulses.

14. The method of claim 8, further comprising executing step (d) once for each possible value of V over one cycle and storing the resultant patterns of pulses and wherein said generating in step (b) includes periodically reading out a pattern of pulses corresponding to the given number V.

15. The method of claim 4, wherein R=C and the width of each pulse is selected from the values zero and one clock period.

16. In a control system, a pulse generator for generating a train of control pulses whose mean level is proportional to a given number V, having N equispaced possible values wherein N is $\geq 1$, and there being provided by the system a train of clock pulses, at a rate C and with, a period 1/C, the pulse generator comprising:

a controlled-width pulse generator (CWPG), operative to generate a train of primary pulses at constant amplitude, constant rate R, greater tan C/N, and constant width, the width being an integral multiple of the clock period; and a pulse width modifier, operative for selecting primary pulses output by said CWPG and for modifying the width of the selected pulses by an integral multiple of the clock period, its output being the train of control pulses;

wherein said constant width, said selecting and said modifying are such that the average pulse width over any period of N clock pulses is proportional to V.

17. The pulse generator of claim 16, wherein said modifying is by an amount 1/C.

18. The pulse generator of claim 17, wherein each of said cycles is N clock periods long and said selecting is a periodic function operating on each successive cycle.

19. The pulse generator of claim 18, wherein N=2 exp(n) (2 to the power n), n being an integer, V is represented by a binary number with n bits and R is chosen so that C/R=2 exp(p), p being an integer, the pulse generator further comprising a first and second register, the first register holding p high-order bits of V and the second register holding s=n−p low-order bits of V, whereby said first register controls the width of said primary pulses and said second register controls said selecting.

20. The pulse generator of claim 16, wherein R=C and the width of each pulse is selected from zero and one clock period.

21. The pulse generator of claim 16, wherein said modifier includes a selector, operative to effect said selecting.

22. The pulse generator of claim 16, wherein said modifier includes:

a secondary pulse generator, operative to generate a secondary pulse for each selected primary pulse, the width of each secondary pulse being essentially equal to the respective modification; and a combiner, operative to combine said secondary pulses with corresponding ones of said selected primary pulses.

23. The pulse generator of claim 22, wherein the value V is represented by a binary number consisting of p high-order bits and s low-order bits, $2^s$=R*N/C, the value of said p high-order bits affecting the width of said primary pulses and the value of said s low-order bits affecting said selecting, both p and s are integers.

24. The pulse generator of claim 23, wherein said secondary pulse generator includes a pulse counter, a lookup table and a pulse selection register.

25. The pulse generator of claim 24, wherein said s low-order bits are fed into said pulse selection register.

26. In a control system, a pulse generator for generating a train of control pulses whose mean level is proportional to a given number V, having N equispaced possible values wherein N is $\geq 1$, and there being provided by the system a train of clock pulses, at a rate C and with a period 1/C, the pulse generator comprising:

a plurality of controlled-width pulse generators, each operative to generate a train of primary pulses at a common constant amplitude, a common constant rate R, greater than C/N, and constant width, the pulse widths of the several trains being mutually different; and a switch, operative to select for each pulse period one of said generated trains and to feed said selected train to a common output terminal;

wherein said constant widths and said selecting are such that at said output terminal the average pulse width over any period of N clock pulses is proportional to V.

27. The pulse generator of claim 26, wherein said plurality of pulse generators in two pulse generators and the pulse widths of the corresponding two trains differ by one clock period.

28. In a control system, a pulse generator for generating a train of control pulses whose mean level is proportional to a given number V, having N equispaced possible values wherein N is $\geq 1$, and there being provided by the system. a train of clock pulses, at a rate C and with a period 1/C, the pulse generator comprising;

a lookup table, having N entries—one for each possible value of V, there being stored at each entry a pattern of a plurality of pulses, the pattern having a length of N clock pulses, the pulses being of various widths and the mean level of each pattern being proportional to the corresponding value of V; and an addressor, operative, for each successive period of N clock pulses, to address said lookup table according to the given number V and to cause the corresponding stored pattern to be read out therefrom so as to become a train of control pulses.

29. In a control system, a method for generating a train of pulses whose mean level is proportional to a given number V, having N equispaced possible values wherein N is $\geq 1$, the pulses to be applied to a given low-pass process, there being defined for the system a clock rate C, with a corresponding clock period 1/C, the method comprising:

(a) logically defining successive time cycles, each being N clock periods long, and logically dividing each cycle into N equal time slots;

(b) For each of said cycles, assigning to each time slot a value selected from zero is and a given pulse amplitude;

wherein said assigning is such that a mean value of all time slots over a respective cycle is proportional to V and that no two adjacent time slots are assigned the pulse amplitude value when V is equal to or less than half its maximum possible value, and no two adjacent time slots are assigned zero value, when V is greater than half its maximum possible value.

* * * * *